United States Patent
Stephens, IV et al.

(10) Patent No.: US 7,330,491 B2
(45) Date of Patent: Feb. 12, 2008

(54) FAULT TOLERANT LASER DIODE PACKAGE

(75) Inventors: Edward F. Stephens, IV, Dittmer, MO (US); Joseph L. Levy, Creve Coeur, MO (US); John S. Whiteley, Maryland Heights, MO (US)

(73) Assignee: Northrop Grumman Space & Missions Systems Corporation, Los Angeles, CA (US)

( * ) Notice: Subject to any disclaimer, the term of this patent is extended or adjusted under 35 U.S.C. 154(b) by 216 days.

(21) Appl. No.: 10/827,981

(22) Filed: Apr. 20, 2004

(65) Prior Publication Data

US 2004/0196879 A1 Oct. 7, 2004

Related U.S. Application Data

(62) Division of application No. 10/246,972, filed on Sep. 19, 2002, now Pat. No. 6,728,275.

(51) Int. Cl.
*H01S 3/04* (2006.01)

(52) U.S. Cl. ..................................... 372/36

(58) Field of Classification Search ................ 372/33, 372/34, 36, 50, 28, 75; 257/706, 355, 656, 257/657; 438/26
See application file for complete search history.

(56) References Cited

U.S. PATENT DOCUMENTS

| | | | |
|---|---|---|---|
| 3,622,906 A * | 11/1971 | Nyul | 257/88 |
| 3,890,161 A | 6/1975 | Brown, III | 136/212 |
| 4,053,860 A * | 10/1977 | Kozacka et al. | 337/164 |
| 4,136,435 A | 1/1979 | Li | 438/22 |
| 5,305,344 A * | 4/1994 | Patel | 372/50.12 |
| 5,394,426 A | 2/1995 | Joslin | 372/50 |
| 5,394,427 A | 2/1995 | McMinn et al. | 372/70 |
| 5,475,349 A | 12/1995 | Cohn | 333/218 |
| 5,495,490 A | 2/1996 | Rice et al. | 372/34 |

(Continued)

FOREIGN PATENT DOCUMENTS

DE 10328440 1/2005

(Continued)

*Primary Examiner*—Wilson Lee
*Assistant Examiner*—Hung Tran Vy
(74) *Attorney, Agent, or Firm*—Nixon Peabody LLP.

(57) ABSTRACT

A laser diode package (10) according to the present invention is tolerant of short-circuit and open-circuit failures. The laser diode package (10) includes a laser diode bar (12), a forward-biased diode (14), a heat sink (18), and a lid (16) which may have fusible links (86). The laser diode bar (12) and the forward-biased diode (14) are electrically connected in parallel between the heat sink (18) and the lid (16). The emitting region of the laser diode bar (12) is aligned to emit radiation away from the forward-biased diode (14). Several packages can be stacked together to form a laser diode array (42). The forward-biased diode (14) allows current to pass through it when an open-circuit failure has occurred in the corresponding laser diode bar (12), thus preventing an open-circuit failure from completely disabling the array (42). The fusible links (86), if used on the lid (16), prevent damaged active regions (90) in a laser diode bar (12) from short-circuiting and drawing more electrical current than the other active regions (90).

14 Claims, 4 Drawing Sheets

U.S. PATENT DOCUMENTS

| | | | |
|---|---|---|---|
| 5,550,852 A * | 8/1996 | Patel et al. | 372/33 |
| 5,715,264 A | 2/1998 | Patel et al. | 372/36 |
| 5,734,672 A | 3/1998 | McMinn et al. | 372/50 |
| 5,761,234 A * | 6/1998 | Craig et al. | 372/75 |
| 5,764,675 A | 6/1998 | Juhala | 372/50 |
| 5,913,108 A | 6/1999 | Stephens et al. | 438/109 |
| 5,985,684 A * | 11/1999 | Marshall et al. | 438/26 |
| 6,018,602 A | 1/2000 | Mayor et al. | 385/27 |
| 6,026,109 A | 2/2000 | Micke et al. | 372/92 |
| 6,061,378 A | 5/2000 | Marshall et al. | 372/75 |
| 6,266,353 B1 * | 7/2001 | Freitas et al. | 372/36 |
| 6,317,443 B1 * | 11/2001 | Craig et al. | 372/38.04 |
| 6,356,574 B1 * | 3/2002 | Craig et al. | 372/75 |
| 6,498,385 B1 * | 12/2002 | Daubenspeck et al. | 257/529 |
| 6,580,150 B1 | 6/2003 | Metzler | 257/594 |
| 6,728,275 B2 * | 4/2004 | Stephens et al. | 372/36 |
| 6,791,181 B2 * | 9/2004 | Horie et al. | 257/706 |
| 7,262,467 B2 * | 8/2007 | Kelberlau | 257/355 |
| 2002/0170747 A1 * | 11/2002 | Chu et al. | 174/256 |

FOREIGN PATENT DOCUMENTS

| | | |
|---|---|---|
| JP | 59103565 | 6/1984 |
| JP | 2002 025784 | 1/2002 |
| WO | WO 00/59086 | 10/2000 |
| WO | WO 03/075423 A1 | 9/2003 |
| WO | WO 2004/062051 A1 | 7/2004 |

* cited by examiner

FAULT TOLERANT LASER DIODE PACKAGE

RELATED APPLICATION

This application is a divisional of U.S. patent application Ser. No. 10/246,972, filed Sep. 19, 2002 now U.S. Pat. No. 6,728,275, now allowed.

BACKGROUND OF THE INVENTION

1. Field of the Invention

The present invention relates generally to lasers diodes and, in particular, to a package that is resistant to sudden short-circuit failures and resistant to sudden open-circuit failures.

2. Discussion of the Related Art

Semiconductor laser diodes have numerous advantages. They are small in that the width of their active regions is typically submicron to a few microns and their height is usually no more than a fraction of a millimeter. The length of their active regions is typically less than about a millimeter. The internal reflective surfaces, which produce emission in one direction, are formed by cleaving the substrate from which the laser diodes are produced and, thus, have high mechanical stability. The laser diode typically has several emitters, each of which is aligned with a corresponding active region.

High efficiencies are possible with semiconductor laser diodes with some pulsed junction laser diodes having external quantum efficiencies near 50%. Semiconductor lasers produce radiation at wavelengths from about 20 to about 0.7 microns depending on the semiconductor alloy that is used. For example, laser diodes made of gallium arsenide with aluminum doping (AlGaAs) emit radiation at approximately 0.8 microns (~800 nm) which is near the absorption spectrum of common solid-state laser rods and slabs made from Neodymium doped, Yttrium-Aluminum Garnet (Nd:YAG), and other crystals and glasses. Thus, semiconductor laser diodes can be used as the optical pumping source for larger, solid-state laser systems.

Universal utilization of semiconductor laser diodes has been restricted by thermal related problems that can cause catastrophic failures. These problems are associated with the large heat dissipation per unit area of the laser diodes which results in elevated temperatures within the active regions and stresses induced by thermal cycling. Laser diode efficiency and the service life of the laser diode is decreased as the operating temperature in the active region increases.

In particular, laser diode bars containing more than one emitter are vulnerable to a sudden short-circuit failure. This short-circuit failure begins when one of the output facets of an emitter begins to absorb optical energy or when heat is not sufficiently dissipated from the emitter. As the temperature rises, the emitter becomes more inefficient and absorbs even more heat, causing a further rise in temperature and, ultimately, a thermal runaway situation. The temperature may reach levels that cause the material of the laser diode bar to melt in the area of the associated active region. Once the melting has occurred, the current and voltage characteristics of the P-N junction at the active region are locally destroyed and, thus, the active region begins to act as a simple resistor. With the P-N junction locally destroyed, current that would normally be distributed equally among all the active regions rushes through the damaged area, depriving the rest of the active regions of some or all of the available current. If the damaged region or regions are large, then it is possible for all of the available current to flow through the damaged region, and the rest of the undamaged active regions and their associated emitters on the laser diode bar become nonfunctional. Thus, an array containing the damaged laser diode bar may continue to draw current, but will have an inadequately low amount of emission or no emission whatsoever.

Additionally, laser diode bars are also vulnerable to sudden open-circuit failure. This failure mode may begin as a short-circuit failure. The emitter that has inadequate heat extraction causes the entire laser diode bar to become heated. The heat causes the soldered electrical connections between the laser diode bar and the adjacent heat sink to melt and the bar delaminates from the adjacent heat sink. Once the separation has occurred, an electrical connection no longer exists, thereby forming an open circuit. This mode of failure is more common in a diode package in which the diode bar is in intimate contact with a solid foil or a ribboned foil as the heat sink. The destruction of the solder bond between the foil and the laser diode bar forces the package into an open-circuit condition.

A need exists for a laser diode package that is not susceptible to short-circuit and open-circuit failures.

SUMMARY OF THE INVENTION

The present invention remedies the short-circuit and open-circuit failures by providing a laser diode package that includes a laser diode bar, a forward-biased diode, a heat sink, and a lid having a plurality of fusible links. The heat sink is electrically connected to the laser diode bar and the forward-biased diode with the emitters of the laser diode bar being aligned to emit radiation away from the forward-biased diode. Opposite the heat sink, the fusible links of the lid are in electrical contact with the laser diode bar, and the main body of the lid is in electrical contact with the forward-biased diode. Accordingly, the laser diode bar and the forward-biased diode are electrically in parallel between the heat sink and the lid.

The individual laser diode packages may be combined into laser diode arrays. Accordingly, the heat sink of a first package is placed in electrical contact with the lid of a second adjacent package. Numerous individual packages can be assembled in such a fashion, resulting in a multi-bar laser diode array.

The lid having the fusible links prevents short-circuit failures because each of the links, which is associated with a corresponding active region and passes the current for that active region, is destroyed like a typical electrical fuse when current levels become too high. Thus, the electrical path to the damaged active region is destroyed, causing the current to flow through the undamaged active regions.

The forward-biased diode prevents open-circuit failures when the packages are formed into laser diode arrays. If a laser diode bar has been electrically disconnected from the rest of the laser diode package due to a reflow of the solder, the forward-biased diode is activated which provides an alternate path for the electrical current. This allows a laser diode array to remain functional even though one of its laser diode bars has been electrically disconnected from the adjacent heat sink.

While the laser diode package may have each of these two mechanisms for decreasing the likelihood of open-circuit or short-circuit failures, the laser diode package can benefit from having just one of these two failure prevention mechanisms. Thus, a laser diode package according to the present invention may contain only the lid having the fusible links or only the forward-biased diode.

The above summary of the present invention is not intended to represent each embodiment, or every aspect, of the present invention. This is the purpose of the Figures and the detailed description which follow.

BRIEF DESCRIPTION OF THE DRAWINGS

The foregoing and other advantages of the invention will become apparent upon reading the following detailed description and upon reference to the drawings.

Figure 1:
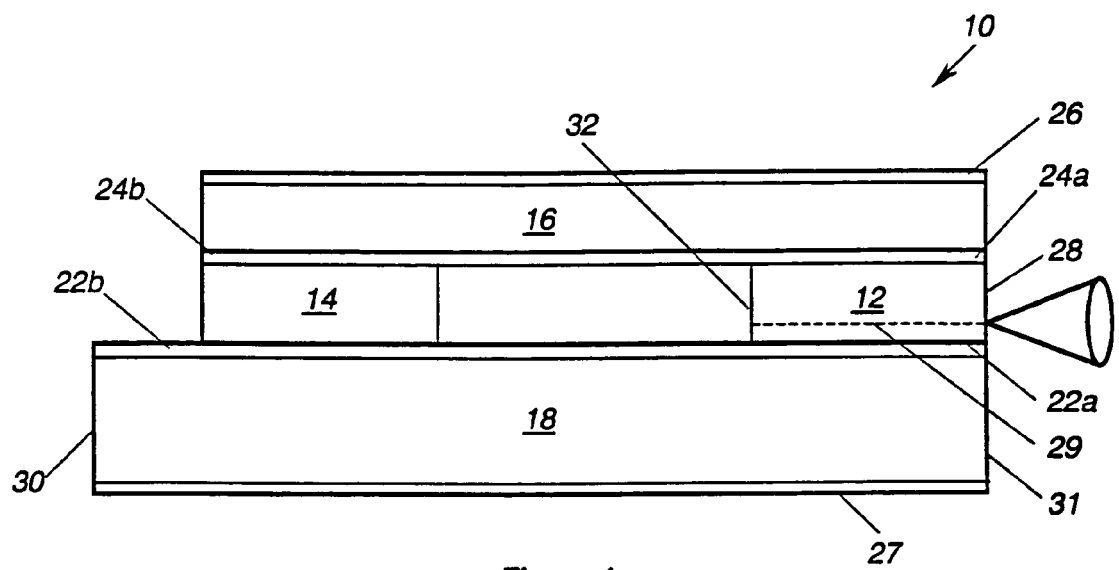
FIG. 1 is a side view of a laser diode package with a forward-biased diode protection.

While the invention is susceptible to various modifications and alternative forms, specific embodiments have been shown by way of example in the drawings and will be described in detail herein. It should be understood, however, that the invention is not intended to be limited to the particular forms disclosed. Rather, the invention is to cover all modifications, equivalents, and alternatives falling within the spirit and scope of the invention as defined by the appended claims.

DETAILED DESCRIPTION OF PREFERRED EMBODIMENTS

In FIG. 1, a side view is shown of a laser diode package 10 containing a laser diode bar 12, a forward-biased diode 14, a lid 16, and a heat sink 18. The laser diode bar 12 is attached to the heat sink 18 through a first solder layer 22a. The forward-biased diode 14 is attached to the heat sink 18 through a second solder layer 22b. The lid 16 is attached to both the laser diode bar 12 and the forward-biased diode 14 with third and fourth solder layers 24a and 24b, respectfully.

The heat sink 18 of the laser diode package 10 is typically made of a material that is both electrically and thermally conductive, such as copper. Electrical conductivity is required to conduct the electrical current through the laser diode bar 12 and produce optical energy. Thermal conductivity is needed to conduct the intense heat away from the laser diode bar 12 and maintain the laser diode bar 12 at a reasonable operating temperature. The heat is conducted from a bottom end 30 of the heat sink 18 that is coupled directly or indirectly to the ultimate thermal reservoir (e.g. a heat exchanger passing a working fluid).

The lid 16 may be a simple foil providing a backside of the package 10. Alternatively, the lid 16 may be useful as a heat path and conduct heat to the ultimate thermal reservoir. In this case, the lid 16 essentially acts, and may be configured, like the heat sink 18.

The heat sink 18 and the lid 16 of the laser diode package 10 may be manufactured in such a way so as to have the material for the solder layers on their exterior surfaces (i.e., "pretinned"). Such structures are described in U.S. patent application Ser. No. 09/280,783 entitled "Laser Diode Packaging" which was filed on Mar. 29, 1999, and is incorporated herein by reference in its entirety. Consequently, the first and second solder layers 22a and 22b and the third and fourth solder layers 24a and 24b can be produced by a single solder layer present on the lid 16 and the heat sink 18, respectively. This eliminates the need to accurately locate individual solder layers for interfacing with the laser diode bar 12 and the forward-biased diode 14, although such a methodology will also perform the desired function. Further, by pretinning the entire lid 16 and the heat sink 18, the lid 16 and the heat sink 18 can have pre-applied solder layers 26 and 27, respectively, allowing the package 10 to be soldered to an adjacent package.

The laser diode bar 12 has an emitting surface 28 and a reflective surface 32 that opposes the emitting surface 28. Active regions 29 of the laser diode bar 12, which are the regions in the laser diode bar 12 where the photons are generated from the input electrical energy, are typically closer to the heat sink 18. The photons propagate through the active regions 29, reflect off the reflective surface 32, and are emitted from the emitting surface 28. It is preferred that the emitting surface 28 be positioned substantially flush (i.e., substantially coplanar) with the end surface 31 of the heat sink 18. In the preferred embodiment, the emitting surface 28 is positioned within about 1 mil (i.e., ±0.001 inch) of the top end 31 of the heat sink 18.

Figure 2:
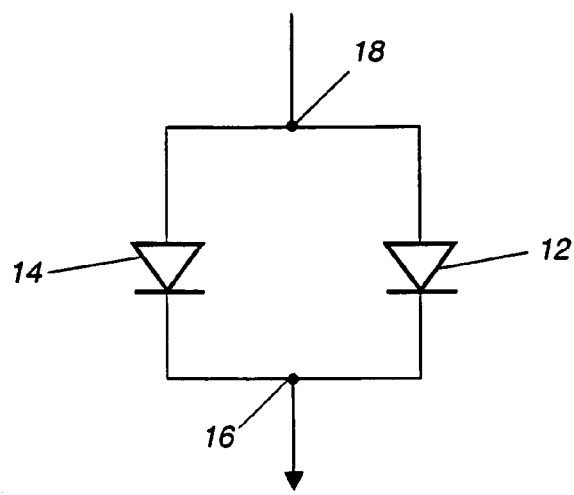
FIG. 2 is a diagrammatic illustration of an equivalent circuit showing the laser diode bar in parallel with the forward-biased diode.

FIG. 2 shows a diagrammatic illustration of an equivalent circuit of the package 10 of FIG. 1 with the laser diode bar 12 being electrically connected in parallel with the forward-biased diode 14 between the heat sink 18 and the lid 16. By providing the forward-biased diode 14 in parallel with the laser diode bar 12, an open-circuit failure can be avoided. In particular, the forward-biased diode 14 has a turn-on voltage which is higher than the turn-on voltage of the laser diode bar 12, usually by a small fraction of a volt. In one embodiment, the forward-biased diode 14 has a turn-on voltage of about 2.8 volts, while the laser diode bar 12 has a turn-on voltage of about 1.6 volts. In normal operation, the equivalent circuit passes electric current entirely through the laser diode bar 12. During an open-circuit failure, an electrical gap results after the third solder layer 24a between the lid 16 and the laser diode bar 12 or the first solder layer 22a between the heat sink 18 and the laser diode bar 12 has been removed. The voltage across the electrical gap adjacent to the laser diode bar 12 begins to build. Because the forward-biased diode 14 is electrically connected in parallel with the laser diode bar 12, the voltage across the forward-biased diode 14 also begins to rise. Eventually, the voltage across the forward-biased diode 14 reaches the tun-on voltage for the forward-biased diode 14 and it becomes activated. When the forward-biased diode 14 is activated, the electrical current can again pass from the heat sink 18 to the lid 16, although the laser diode bar 12 emits no radiation.

Figure 3A:
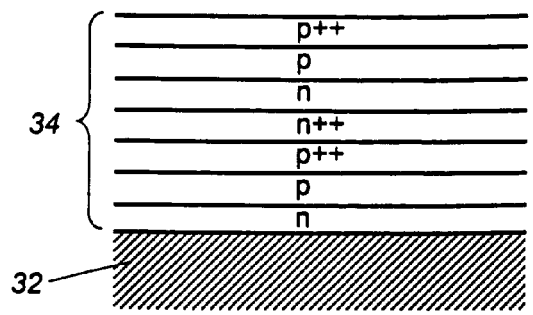
FIG. 3A is a schematic illustration of a forward-biased diode which consists of epitaxial layers grown on a gallium arsenide substrate.
Figure 3B:
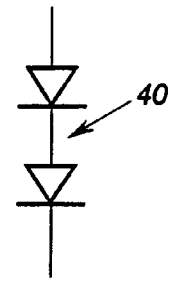
FIG. 3B is a diagrammatic illustration of the equivalent circuit resulting from the epitaxial structure FIG. 3A.

FIGS. 3A and 3B illustrate a cross-sectional schematic view and resulting circuit, respectively, of one possible configuration for the forward-biased diode 14. In this configuration, the forward-biased diode 14 is made of a gallium arsenide substrate 32 with epitaxial layers 34 grown on its outer surface. The substrate 32 is preferably an $n^+$-type substrate. The epitaxial layers 34 provide a stacked diode doping profile on the substrate 32 that creates a two junction stacked diode with a turn-on voltage that is greater than the turn-on voltage of the laser diode bar 12. An equivalent circuit 40 of the epitaxial layers 34 is shown in FIG. 3B as two diodes in series. The forward-biased diode 14 constructed in this manner will provide open-circuit protection for laser diode bars that emit radiation with a wavelength of 700 nm or higher.

While not shown in FIGS. 3A and 3B, the forward-biased diode 14 contains metalization on its surfaces that allow it to be electrically connected with the solder layers 22b and 24b of the heat sink 18 and the lid 16. In addition to the electrical function of the forward-biased diode 14, it also serves as a precise spacer between the heat sink 18 and the lid 16. Thus, once the epitaxial layers 34 are grown on the substrate 32 and metalization is applied, the wafer is precisely scribed and cleaved to the proper dimensions. While the embodiment of FIGS. 3A-3B has been described with the substrate 32 being made of gallium arsenide, silicon could also be used.

Figure 4:
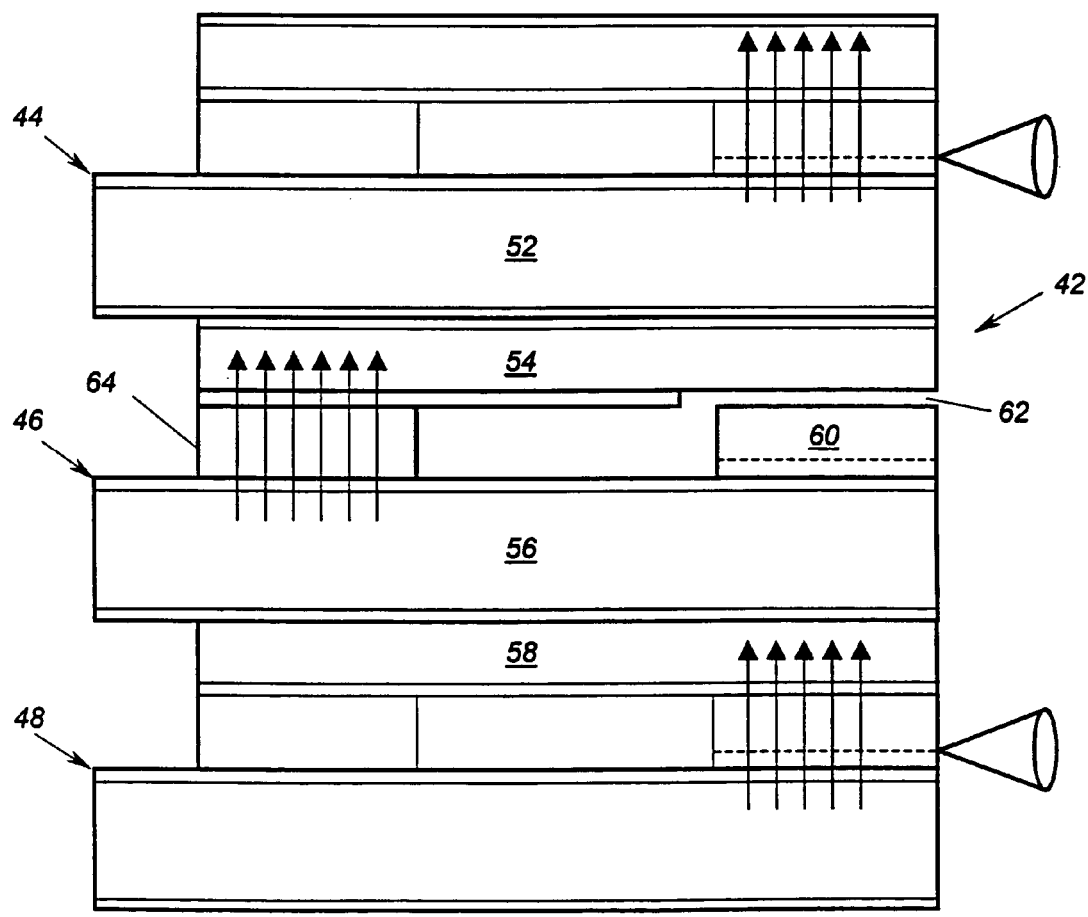
FIG. 4 is a side view of three laser diode bar packages arranged in a laser diode array which has an open circuit at one laser diode, but an activated forward-biased diode.

FIG. 4 shows a side view of a laser diode array 42 composed of three stacked laser diode packages 44, 46 and 48 with forward-biased diode protection. A heat sink 52 of the upper laser diode package 44 is soldered to a lid 54 of the middle laser diode package 46. Similarly, the heat sink 56 of the middle laser diode package 46 is soldered to the lid 58 of the lower laser diode package 48.

Under normal conditions, an equal current flows through each laser diode bar in the laser diode packages 44, 46 and 48 because the laser diode packages 44, 46 and 48 are electrically connected in series. FIG. 4, however, shows that the middle laser diode bar 60 has experienced an open-circuit failure 62 in which its solder layer has been melted away such that the laser diode bar 58 is delaminated from the lid 54. According to the prior art systems, once the open-circuit failure occurs, the flow of current through the laser diode array 42 would be terminated and the entire laser diode array 42 would be nonfunctional. In the present invention, after the open-circuit failure in the damaged laser diode bar 60 occurs, the voltage drop across the forward-biased diode 64 in the laser diode package 46 begins to rise. When the turn-on voltage is reached, the forward-biased diode 64 allows current to pass through it such that the current also passes through the undamaged laser diode bars of the upper laser diode package 44 and the lower laser diode package 48. Consequently, although an open-circuit condition existed, the laser diode array 42 still emits radiation from all bars except the damaged laser diode bar 60.

Figure 5:
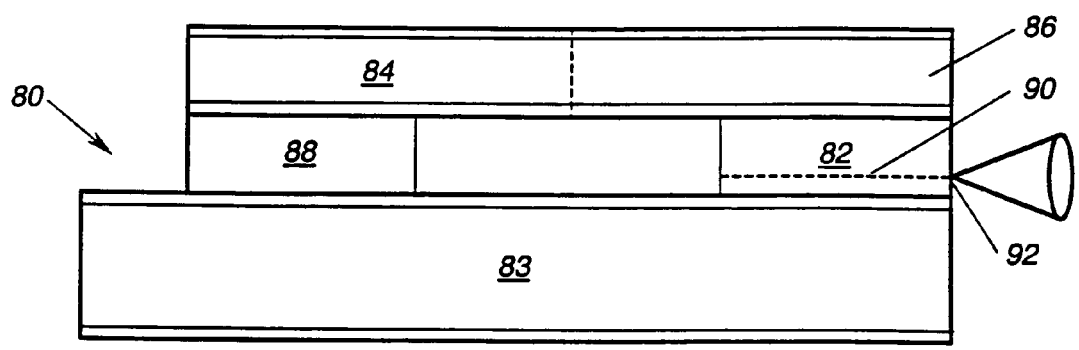
FIG. 5 is a side view of a laser diode package with a lid having fusible links.
Figure 6:
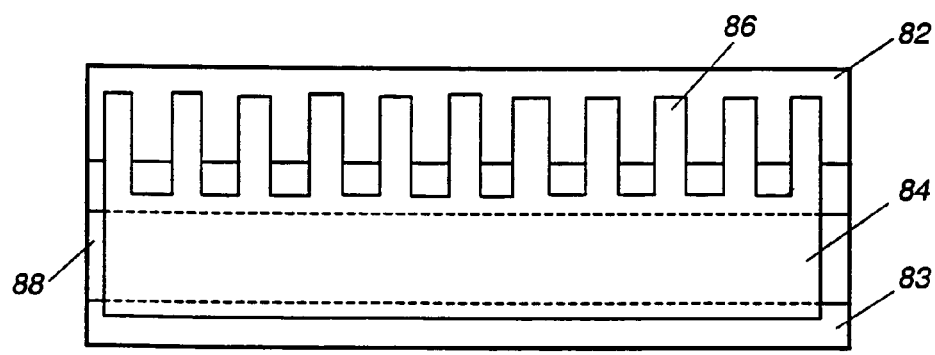
FIG. 6 is a top view of the laser diode package of FIG. 5 from the lid-side of the package that shows each of the fusible links on the lid.

FIGS. 5 and 6 illustrate top and side views of a laser diode package 80 featuring a laser diode bar 82 that is coupled between a heat sink 83 and a lid 84 having fusible links 86. The lid 84 is made of a metallic foil with the fusible links 86 being developed through etching or mechanical stamping. The laser diode bar 82 has active regions 90 emitting energy along the length of the laser diode bar 82. Each active region 90 has a corresponding emitter 92 located on the emitting surface of the laser diode bar 82. Electrical power is guided to the active regions 90 by providing more electrically conductive material within the active regions 90 than in areas between the active regions 90.

A spacer 88 may be placed between the lower portions of the heat sink 83 and the lid 84. The spacer 88 may simply be for maintaining the appropriate space between the heat sink 83 and the lid 84, or can be the forward-biased diode that is used for the purpose described above with respect to FIGS. 1-4.

The utility of the fusible links 86 will be described with reference to FIGS. 7A-7C, all of which are end views looking at the end of the package 80 from which the light would be emitted from the laser diode bar 82. As mentioned previously, a short-circuit failure is caused by one or more of the active regions 90 malfunctioning and experiencing localized melting of the material that comprises the laser diode bar 82. The resulting lower resistance causes the damaged active region to pass more current than is being passed in the other active regions 90 of the laser diode bar 82.

Figure 7A:
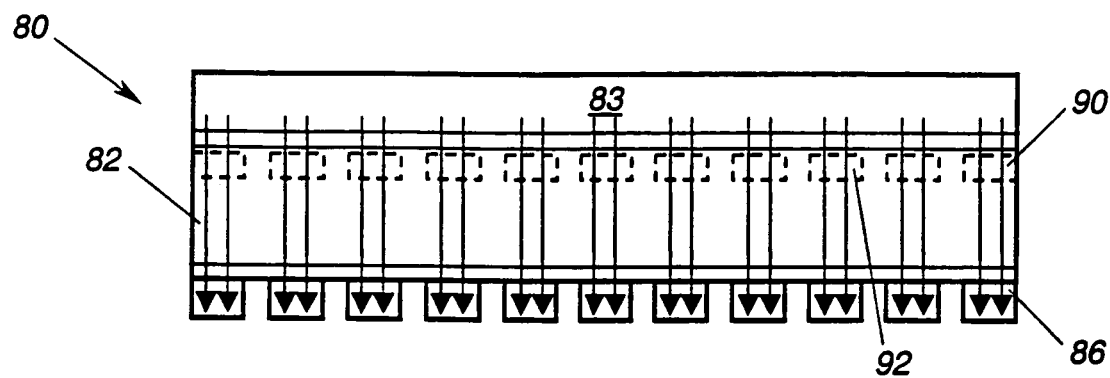
FIG. 7A is an end view of the laser diode package of FIG. 5 from the emitting side of the laser diode showing the current evenly distributed among the constituent active regions.

FIG. 7A illustrates the normal operating condition where the current flows through each of the eleven active regions 90 in a substantially equal proportion. While only eleven active regions 90 are shown, the invention is applicable to laser diode bars 82 having more or fewer active regions 90. Because the fusible links 86 are soldered to the laser diode bar 82, a substantially equal portion of the current flows through each of the fusible links 86. As shown, each active region 90 has one corresponding fusible link 86. In an alternative embodiment, however, each fusible link 86 may create a current path for a group of active regions 90.

Figure 7B:
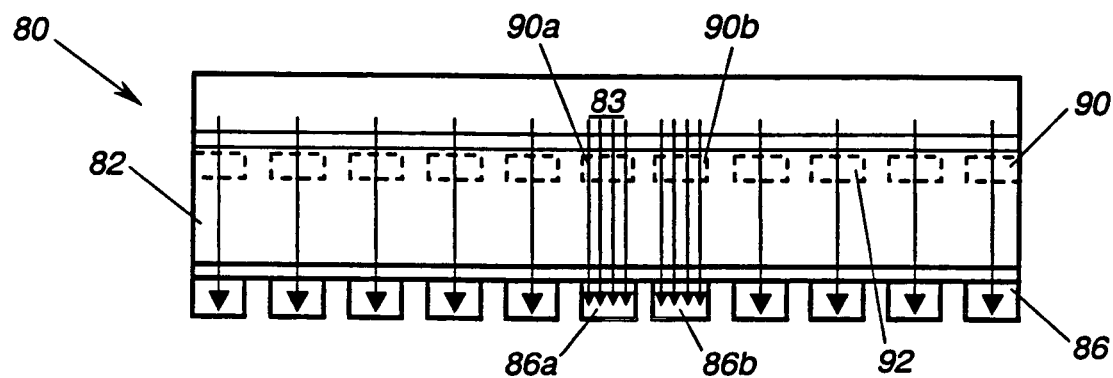
FIG. 7B is an end view of the laser diode package of FIG. 5 showing excessive current travelling through two damaged active regions, thereby causing a short-circuit failure.

FIG. 7B illustrates a transient condition whereby current begins to flow at an abnormally high rate through two active regions 90a and 90b that have been damaged. If the damaged active regions 90a and 90b are large enough, all of the available current will flow through those damaged active regions 90a and 90b and the rest of the emitters 92 on the laser diode bar 82 will become nonfunctional. Thus, the fusible links 86a and 86b associated with these two active regions 90a and 90b begin to achieve current levels that they cannot accommodate. The fusible links 86 are designed such that if a certain excessive amount of current is passed therethrough, the fusible link 86 destroys itself. Thus, the fusible links 86 are frangible structures that are destroyed at a predetermined current level.

Figure 7C:
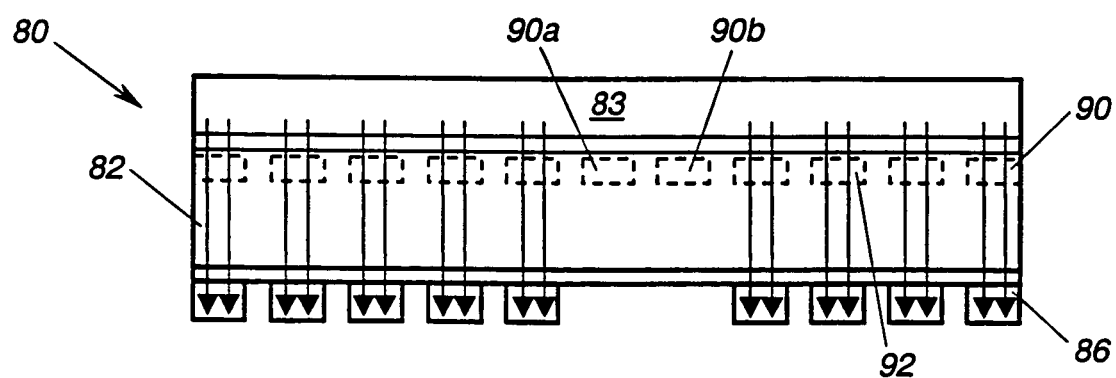
FIG. 7C is an end view of the laser diode package of FIG. 5 showing the obliteration of the two fusible links corresponding to the two damaged active regions of FIG. 7B, thereby causing the current to again be evenly distributed among the constituent active regions.

FIG. 7C illustrates the condition after FIG. 7B in which the fusible links 86a and 86b are destroyed, thereby inhibiting the passage of current through damaged active regions 90a and 90b. As such, current continues to flow through the other functional fusible links 86 and, thus, the rest of the active regions 90 of the laser diode bar 82 remain functional and their corresponding emitters 92 emit the appropriate energy.

The fusible links 86 prevent a short-circuit failure, which can lead to an open-circuit failure due to the intense heat concentration that may cause the reflow of the solder layers. Therefore, preventing short-circuit failure is also a preventative measure against an open-circuit failure. Thus, to some extent, the fusible links 86 also guard against open-circuit failures.

The lid 84 and, thus, the links 86 are preferably made of a fusible alloy, such as Indalloy™ #117, Indalloy™ #158 or Indalloy™ #281. For a known cross-sectional area, these fusible alloys have a certain resistivity per unit length such that a known current will produce a known amount of heat. When the current exceeds a predetermined value, the resultant heat causes the temperature of the link 86 to rise above the melting temperature of the link 86 so that a portion of the link 86 melts and the link 86 is no longer electrically connected to the laser diode 82. For example, if the current through one link 86 exceeds three times the normal operating current, that amount of current produces enough heat to cause melting of the link 86.

While the present invention has been described with reference to one or more particular embodiments, those skilled in the art will recognize that many changes may be made thereto without departing from the spirit and scope of the present invention. Each of these embodiments and obvious variations thereof is contemplated as falling within the spirit and scope of the claimed invention, which is set forth in the following claims.

What is claimed is:

1. A laser diode package, comprising:
    a laser diode bar containing a plurality of active regions in which electrical energy is converted to optical energy, said laser diode bar having a first side and a second side;
    a current path for each of said plurality of active regions, each of said current paths delivering said electrical energy to an associated one of said active regions, each current path including a fusible region configured to melt in response to current exceeding a predetermined value, said current path including a unitary metal foil located external to said laser diode bar, said unitary metal foil including a plurality of integrally connected links comprised of fusible material, said plurality of integrally connected links providing said fusible regions; and
    a heat sink in electrical contact with said first side of said laser diode bar, and
    wherein said unitary metal foil is a lid having said plurality of integrally connected links in electrical contact with said second side of said laser diode bar, each link providing said current path for at least one of said plurality of active regions.

2. The laser diode package of claim 1, wherein said fusible material is one selected from the group consisting of Indalloy® #117, Indalloy®#158 or Indalloy® #281.

3. The laser diode package of claim 1, wherein each of said plurality of links includes said fusible regions and provides said current path for only one of said active regions.

4. The laser diode package of claim 1, wherein each of said plurality of links includes said fusible regions and provides said current path for more than one of said active regions.

5. The laser diode package of claim 1 further including an electrically insulating spacer positioned between said heat sink and said lid.

6. The laser diode package of claim 1, further including a forward-biased diode positioned between said heat sink and said lid, said forward-biased diode being arranged to conduct current from said heat sink to said lid in response to an open-circuit failure in said laser diode bar, said forward-biased diode having a turn-on voltage in the direction of said current that is greater than a turn-on voltage in the direction of said current of said laser diode bar under normal operating conditions.

7. The laser diode package of claim 6, wherein said forward-based diode acts as a precise spacer between said heat sink and said lid.

8. The laser diode package of claim 1, wherein each of said plurality of links on said lid is associated with only one of said active regions.

9. The laser diode package of claim 1, wherein said metallic foil of said lid is a fusible alloy.

10. A laser diode package of claim 1, wherein said fusible material is a fusible alloy.

11. A method for inhibiting the effects of a short-circuit failure in a laser diode having a plurality of active regions for producing optical energy, comprising:
    providing a current path for each of said active regions, each of said current paths including segments located within a solid metallic structure that is distinct from and external to said laser diode, each current path including a region having a fusible material, said solid metallic structure being mounted to said laser diode and including said fusible material, said solid metallic structure being a lid attached to a first side of said laser diode, and wherein a heat sink is located on a second side of said laser diode;
    applying current to said current paths; and
    destroying one of said current paths in response to a current flow through said one of said current paths exceeding a predetermined value.

12. The method of claim 11, wherein said destroying includes melting said fusible material in response to said current flow exceeding said predetermined value.

13. The method of claim 11, wherein said region of fusible material is associated with only one of said active regions.

14. A laser diode package, comprising:
    a laser diode bar containing a plurality of active regions in which electrical energy is converted to optical energy;
    a current path for each of said plurality of active regions, each of said current paths delivering said electrical energy to an associated one of said active regions, each current path including a fusible region configured to melt in response to current exceeding a predetermined value, said current path including a unitary metal foil located external to said laser diode bar, said unitary metal foil including a plurality of integrally connected links comprised of fusible material, said plurality of integrally connected links providing said fusible regions; and
    wherein said predetermined value is at least 3 times an operating current for said link under normal operating conditions.

* * * * *